United States Patent [19]
Tang

[11] Patent Number: 5,661,424
[45] Date of Patent: Aug. 26, 1997

[54] FREQUENCY HOPPING SYNTHESIZER USING DUAL GATE AMPLIFIERS

[75] Inventor: Douglas D. Tang, Chelmsford, Mass.

[73] Assignee: GTE Laboratories Incorporated, Waltham, Mass.

[21] Appl. No.: 10,033

[22] Filed: Jan. 27, 1993

[51] Int. Cl.⁶ .................. H03B 21/00; H03L 7/00
[52] U.S. Cl. .......... 327/105; 327/113; 327/114; 327/116; 327/119; 327/355; 455/332; 455/333
[58] Field of Search .................. 307/529, 271, 307/308; 328/14, 15, 160; 332/100, 102, 103, 105; 327/105, 113, 116, 119, 355, 114; 455/332, 333, 323

[56] References Cited

U.S. PATENT DOCUMENTS

| | | | |
|---|---|---|---|
| 3,475,626 | 10/1969 | Holzman et al. | 307/529 |
| 4,159,526 | 6/1979 | Mosley, Jr. et al. | 328/14 |
| 4,308,473 | 12/1981 | Carnes | 327/113 |
| 4,726,039 | 2/1988 | Piesinger | 332/105 |
| 4,841,169 | 6/1989 | Tsironis | 307/529 |
| 5,075,632 | 12/1991 | Payne et al. | 307/308 |
| 5,140,198 | 8/1992 | Atherly et al. | 307/529 |
| 5,184,093 | 2/1993 | Itoh et al. | 328/14 |

Primary Examiner—Timothy P. Callahan
Assistant Examiner—Dinh T. Le
Attorney, Agent, or Firm—Leonard C. Suchyta

[57] ABSTRACT

A frequency hopping synthesizer is constructed from two FET-based multiplier circuits each responsive to a carrier input signal and a modulation signal to produce respective output signals which are in-phase combined to provide a frequency-shifted signal. The multiplier circuits each comprise two dual-gate field effect transistor (FET) amplifiers which are electrically balanced to suppress unmodulated carrier components so that only the modulated carrier signal appears. The respective carrier input signals and modulation signals are in quadrature phase relationship. A direct digital synthesizer controllably generates signal components which serve as the modulation signals for the multiplier circuits.

7 Claims, 10 Drawing Sheets

FREQUENCY HOPPING SYNTHESIZER USING DUAL GATE AMPLIFIERS

FIELD OF THE INVENTION

The present invention relates to frequency hopping communication systems and, more particularly, to a frequency hopping synthesizer using dual gate multipliers.

BACKGROUND OF THE INVENTION

There are four basic types of frequency synthesizers used in conventional frequency hopping communication systems. These include indirect synthesizers, direct synthesizers, hybrid combinations of indirect and direct synthesizers, and phase modulating synthesizers.

An indirect synthesizer includes a programmable counter for dividing the output frequency of a voltage controlled oscillator (VCO) by N, and a phase detector for comparing the output frequency of the counter with that of a reference frequency. The detector generates an error voltage proportional to the difference between these two frequencies which drives a phase-lock loop that maintains the output frequency of the VCO at N times that of the reference. The output frequency of the VCO can therefore be changed by programming the variable counter to any desired ratio N.

The switching speed of this type of synthesizer depends on the gain bandwidth characteristics of the phase-lock loop and the propagation delay through the variable counter. However, the switching speed of an indirect synthesizer is usually slow and is generally in the millisecond range due to the settling time in the phase-lock loop circuits. Though indirect synthesizers are simple to build, they are not suitable for high hopping rate synthesizer applications. A ping-pong technique, however, can be used to alleviate the problem associated with low switching speed. In particular, while one synthesizer provides the operating frequency, the second is being set to the next new frequency. The second unit is switched in at the time the new frequency is required. This process then repeats with the first unit in a ping-pong fashion.

A direct synthesizer consists of comb generators, frequency multipliers, filters, and switches arranged in mix-and-divide-add-and-divide circuits, or a combination of both. In this type of synthesizer, all of the required carrier frequencies are always present. A narrow band filter filters out unwanted frequency components from each desired carrier, while banks of switches are used to select the desired frequency. The switching speed of a direct synthesizer depends on the switching speed of the switches, the propagation delay of all the cascaded circuits between the source and the final output, and the bandwidth of the narrowest filter in the cascaded circuits. The delay due to filter bandwidth is 0.5/BW, where BW is the filter's 3 dB bandwidth.

Hybrid combinations of direct and indirect synthesizers replace some or all of the switchable rf sources with indirect phase-lock loop synthesizers. Since each of these phase-lock synthesizers can generate a much larger number of base frequencies than either frequency multipliers or comb generators, the number of multipliers, mixers and switches required for a given number of frequencies can be greatly reduced.

A phase modulating synthesizer causes a frequency shift in the carrier by changing the accumulated incremental phase shift as a function of time. A conventional technique is to use a tapped delay line with M taps, thereby dividing the period of the carrier frequency into M equal time steps. When the M delay taps are sequentially selected in equal discrete time steps of $T_n/M$, for example, the carrier frequency will be shifted by $f_n=1/T_n$.

Another example of a phase modulating synthesizer is to use a quadrature phase-shift-keyed (QPSK) modulator. A QPSK modulator consists of two BPSK (bi-phase-shift-keyed) modulators connected in quadrature. Each BPSK modulator consists of hybrids and Schottky barrier diodes. Since Schottky barrier diodes are two-state on-off devices, four discrete phase states of $-45°, -135°, -225°$, and $-315°$ corresponding to the four data values 11, 10, 00, and 01 are obtained. When these four phase states are switched cyclically in equal time intervals, a frequency shift will result. The frequency shift is given by the reciprocal of the total time it takes to cycle through the four data values.

The performance of a frequency shifter is evaluated by examining the levels of feed-through carrier and the undesired sidebands. The level of feed-through carrier depends on how the modulator is configured. In a QPSK modulator, the carrier feed-through depends on the phase and amplitude balance between the circuits. In a discrete phase accumulative type of frequency shifter, both the frequency spacing and the level of undesired side bands depend on M, the number of phase steps used. If $f_o$ is the applied carrier frequency and $f_m$ is the applied frequency shift, then the desired new carrier frequency is $f_o-f_m$ (or $f_o+f_m$ when the accumulated phase increases with time). The side bands are spaced at $Mf_m$ apart. The upper side band level is $-20\text{Log}(M-1)$, and the lower side band is $-20\text{Log}(M+1)$. (The reverse is true for the $f_o+f_m$ case.) For M=4, the two side band levels are $-9.5$ dB and $-14.1$ dB. For M=8, these side band levels are $-16.9$ dB and $-19.1$ dB.

From the above, it can be seen that for phase accumulative frequency shifters, levels of undesired side bands can be reduced only by increasing the number of phase accumulation steps. This will result in increased complexity of the synthesizer due to an increased number of phase accumulation stages. Increasing the number of time steps not only slows down the switching time between frequencies, but also imposes an upper frequency limit in $f_m$.

OBJECTS OF THE INVENTION

It is an object of the present invention to obviate the above-noted and other disadvantages of the prior art.

It is a further object of the present invention to provide a frequency hopping synthesizer capable of fast frequency shifting.

It is a further object of the present invention to provide a frequency shifter exhibiting significant sideband and carrier suppression.

SUMMARY OF THE INVENTION

The present invention relates to a multiplier circuit comprising a first FET amplifier means responsive to a carrier signal and a modulation signal to produce a composite FET output signal comprising an unmodulated and modulated carrier component; and a second FET amplifier means responsive to an inverted version of said carrier signal and a DC input to produce an unmodulated carrier FET output signal. The multiplier further comprises a means coupled to said first and second FET amplifier means for in-phase combining the composite FET output signal and the unmodulated carrier FET output signal.

In another aspect of the present invention, a frequency shifter comprises a first FET multiplier means responsive to a first carrier signal and a first modulation signal to produce a first modulated carrier component; and a second FET multiplier means responsive to a second carrier signal and a second modulation signal to produce a second modulated carrier component. The frequency shifter further comprises a summation means coupled to said first and second FET multiplier means for in-phase combining the first and second modulated carrier component to produce a frequency-shifted carrier output. Each of the FET multiplier means includes a respective multiplier circuit as described above.

BRIEF DESCRIPTION OF THE DRAWINGS

For a better understanding of the present invention, together with other objects, advantages and capabilities thereof, reference is made to the following Description and appended Claims, together with the Drawings, in which:

DETAILED DESCRIPTION OF THE PREFERRED EMBODIMENTS

Figure 1:
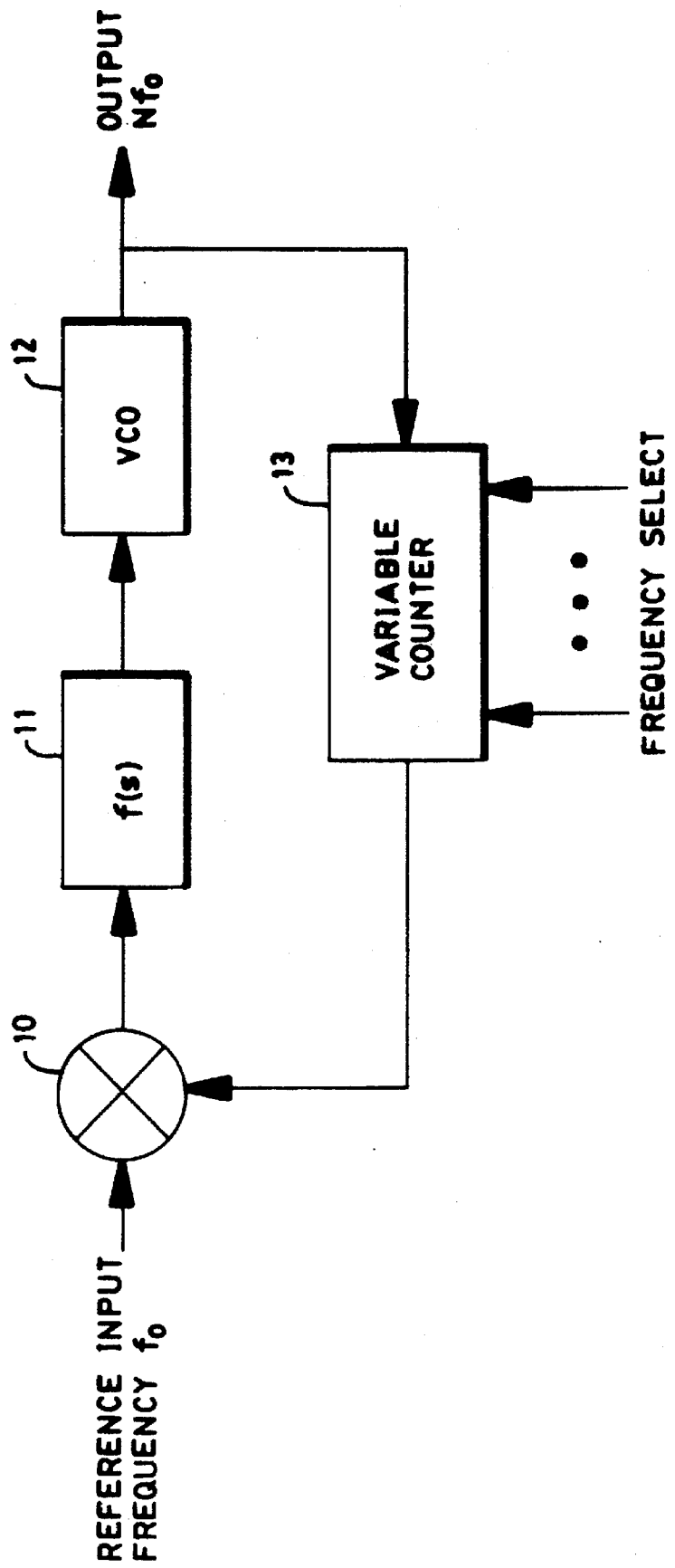
FIGS. 1–5 show a series of prior art frequency synthesizers.
Figure 2A:
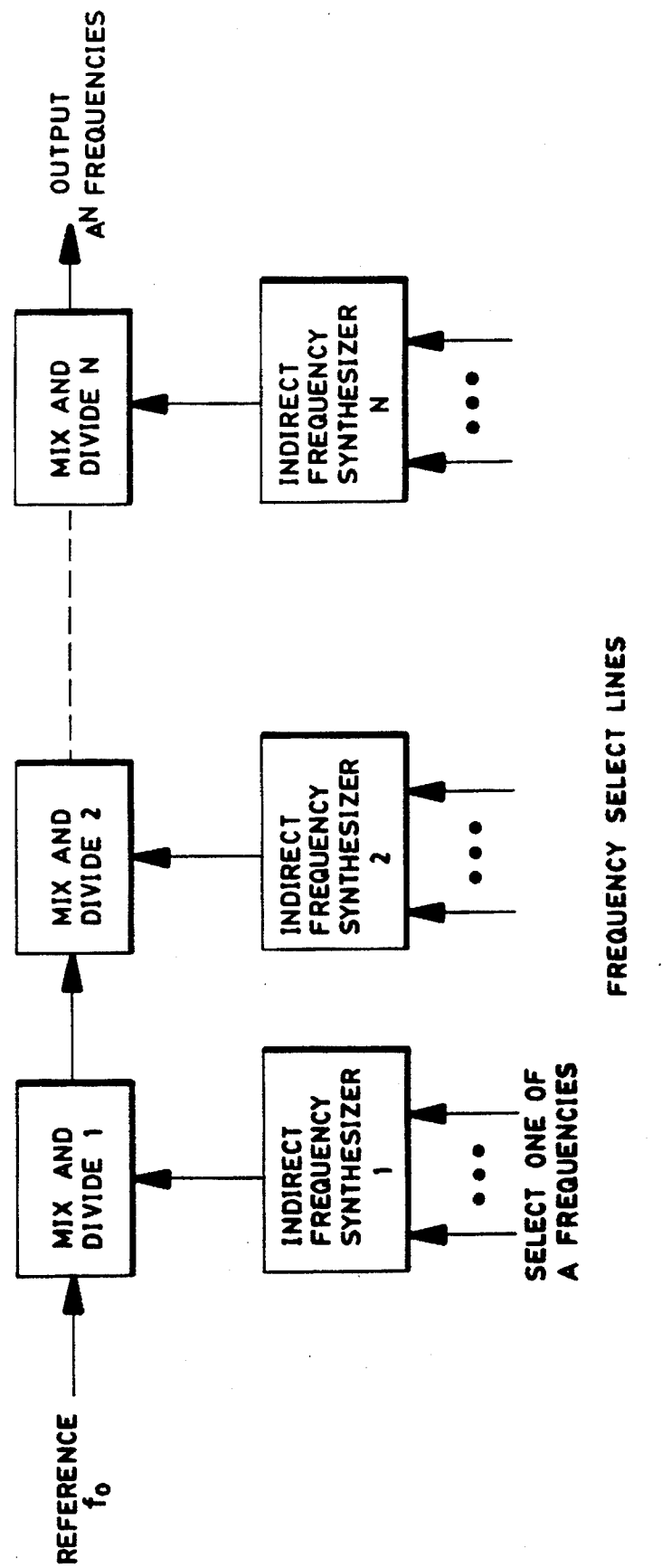
Figure 2B:
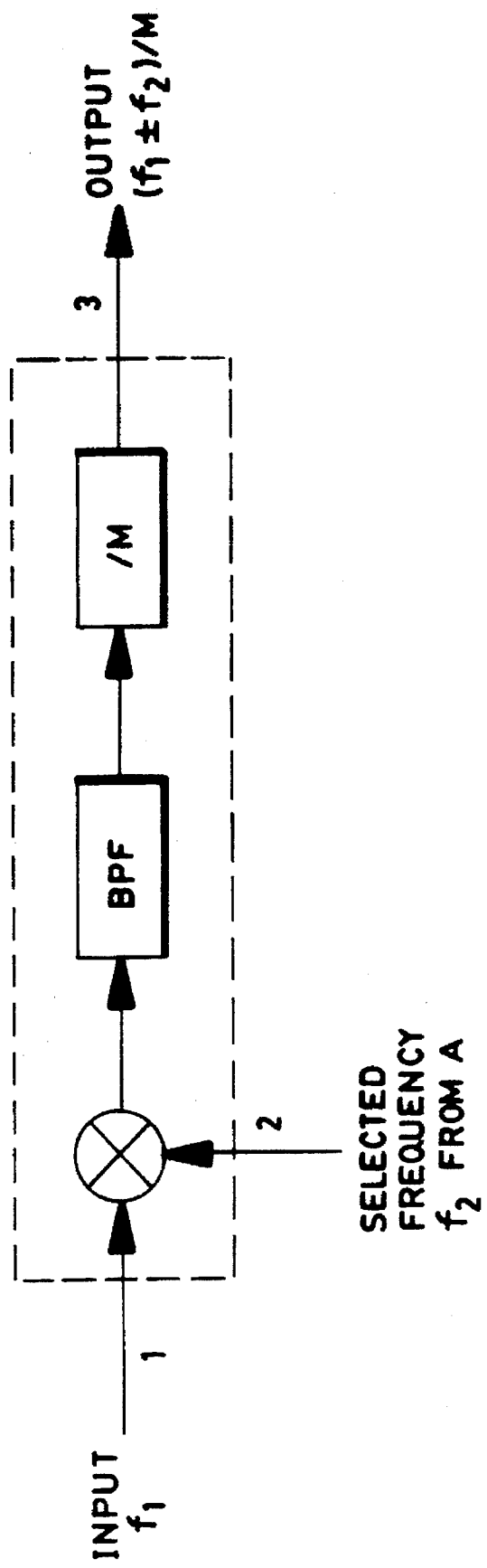
Figure 2C:
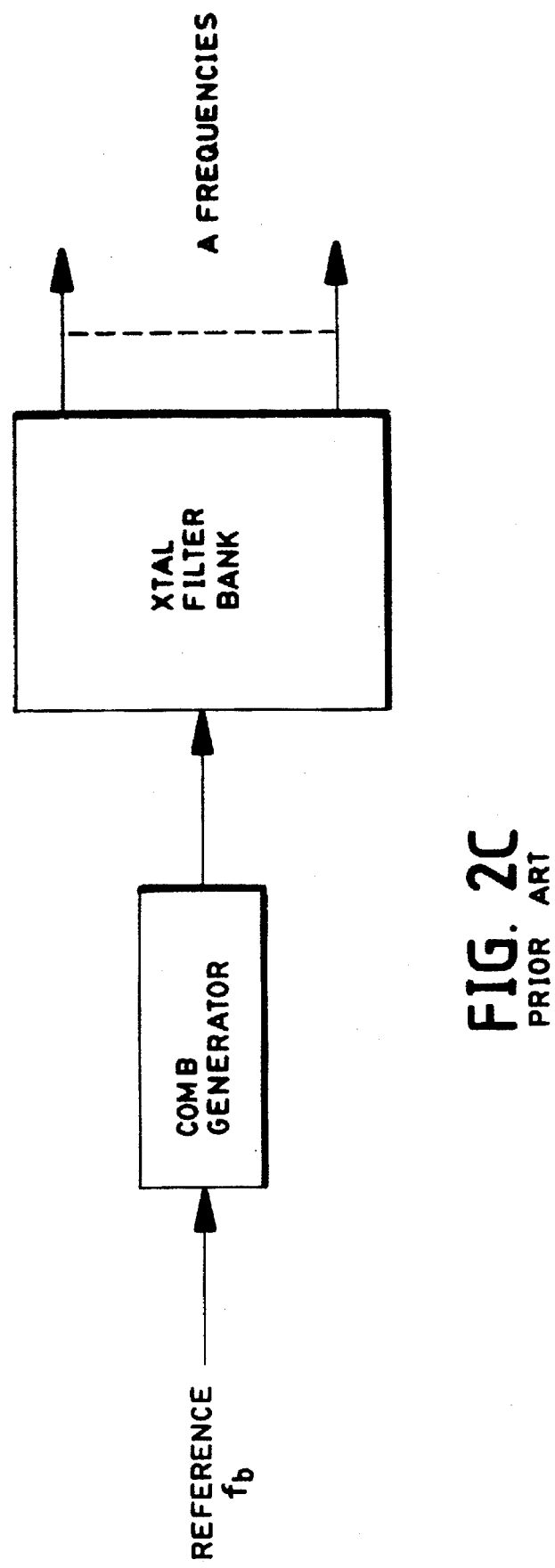

FIGS. 1–5 illustrate prior art designs for the frequency synthesizers detailed in the Background of the Invention section. FIG. 1 shows an indirect synthesizer including a phase detector 10, loop filter 11, voltage controlled oscillator (VCO) 12, and programmable counter 13. FIG. 2A shows a direct synthesizer including a bank of indirect frequency synthesizers coupled to a bank of mix-and-divide modules. FIG. 2B illustrates an implementation for a mix-and-divide module. FIG. 2C shows the use of a comb generator to produce a set of different frequencies.

Figure 3:
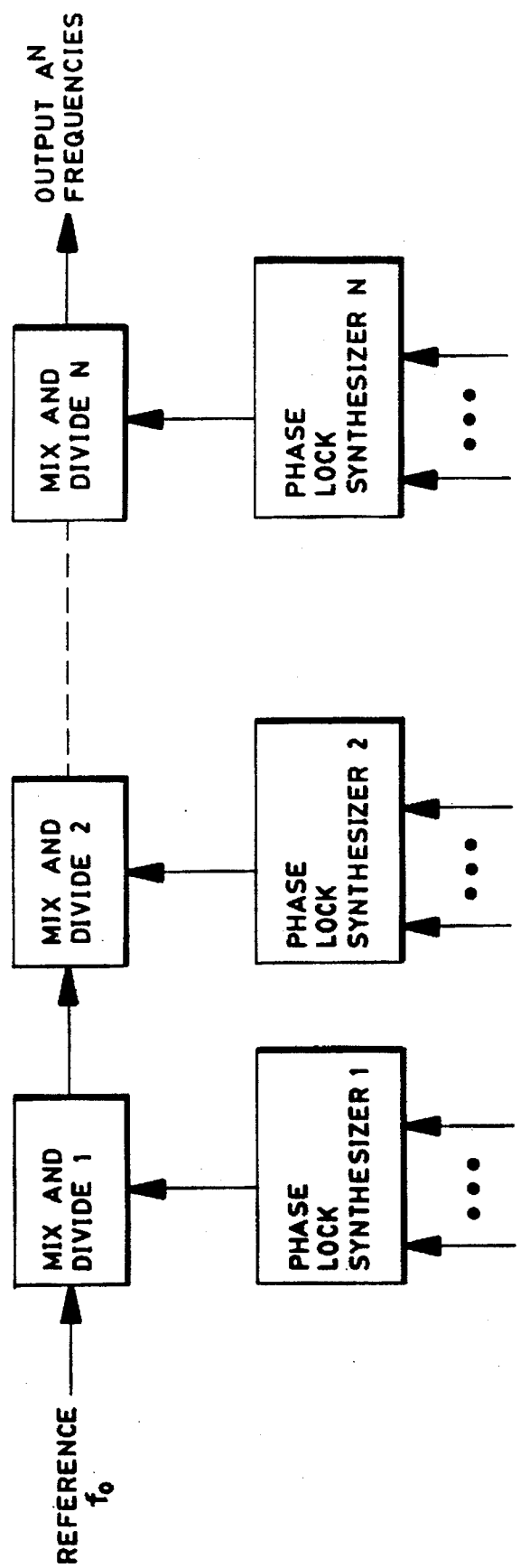
Figure 4:
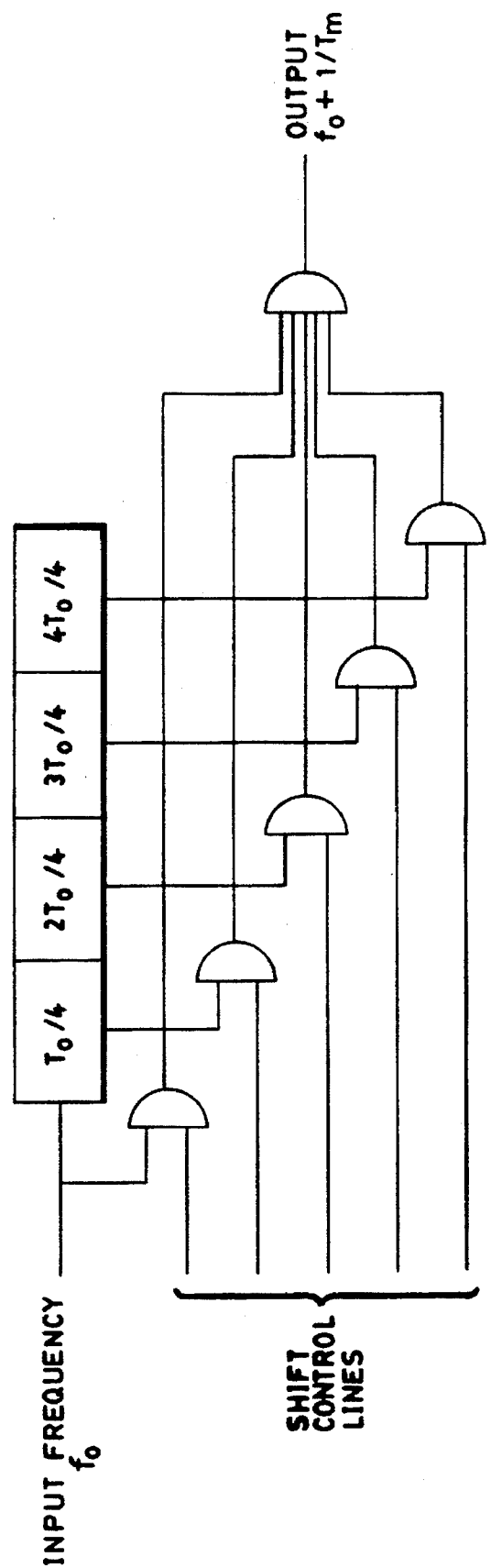
Figure 5:
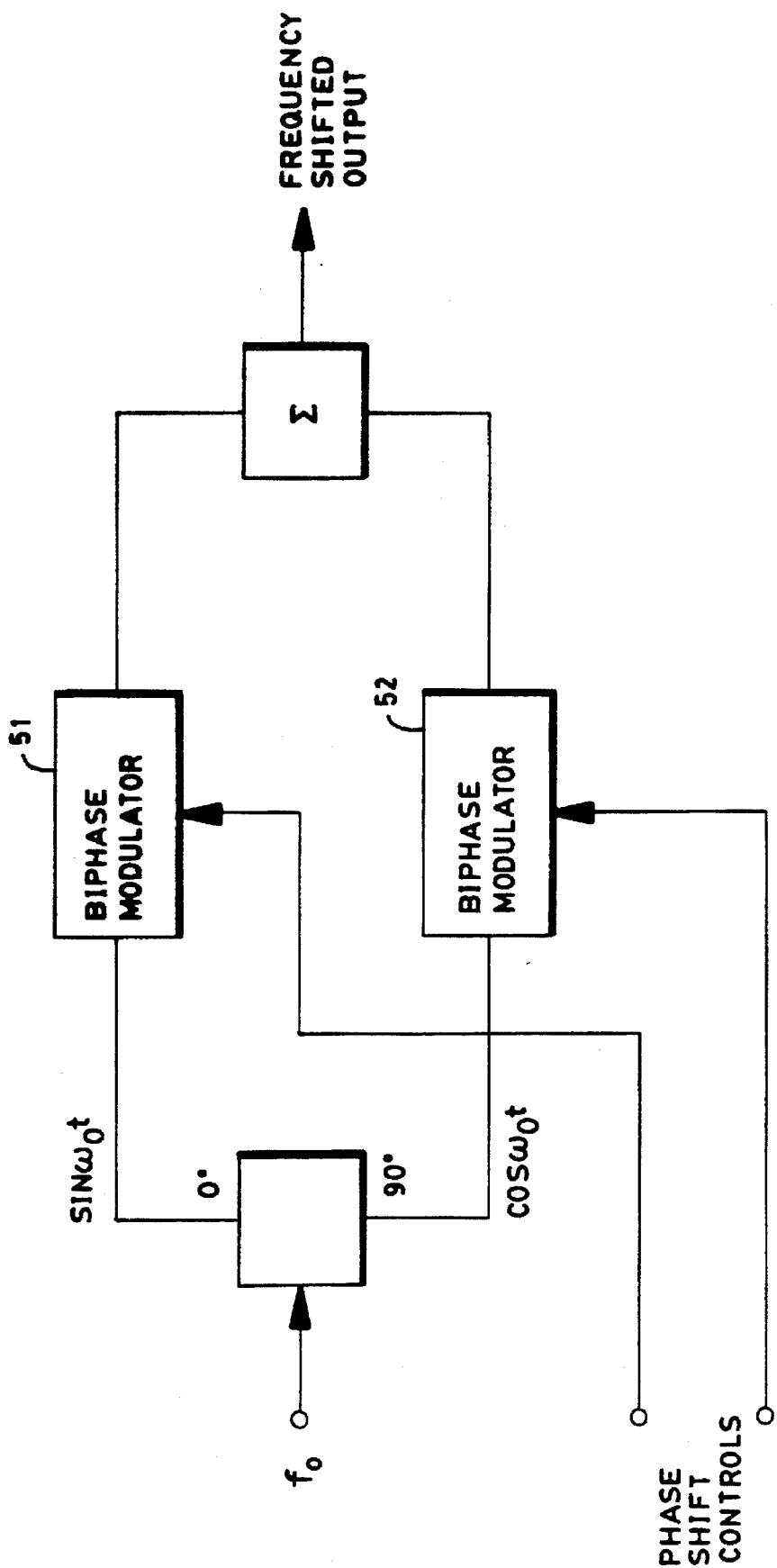

FIG. 3 shows a hybrid synthesizer including a bank of phase-lock loop synthesizers coupled to a bank of mix-and-divide modules. FIG. 4 shows a particular implementation of a phase modulating synthesizer using M=4 switched tapped delay lines. FIG. 5 shows a four-state phase modulating frequency synthesizer comprising a QPSK modulator with two BPSK modulators 51 and 52 connected in quadrature.

The following discussion of the theory of operation for an ideal multiplier device provides a suitable introduction to the details of the present invention. In such a device, a means is provided for executing a multiplicative operation on two input signals $S_i$ and $v_c$ to produce an output signal $S_o = A v_c S_i$. The variable A corresponds to the gain constant of the multiplier, while variable $v_c$ represents the applied control voltage. The signal $v_c$ serves a modulation function Since variations to $v_c$ will modify (e.g., modulate) signal $S_i$.

Figure 6:
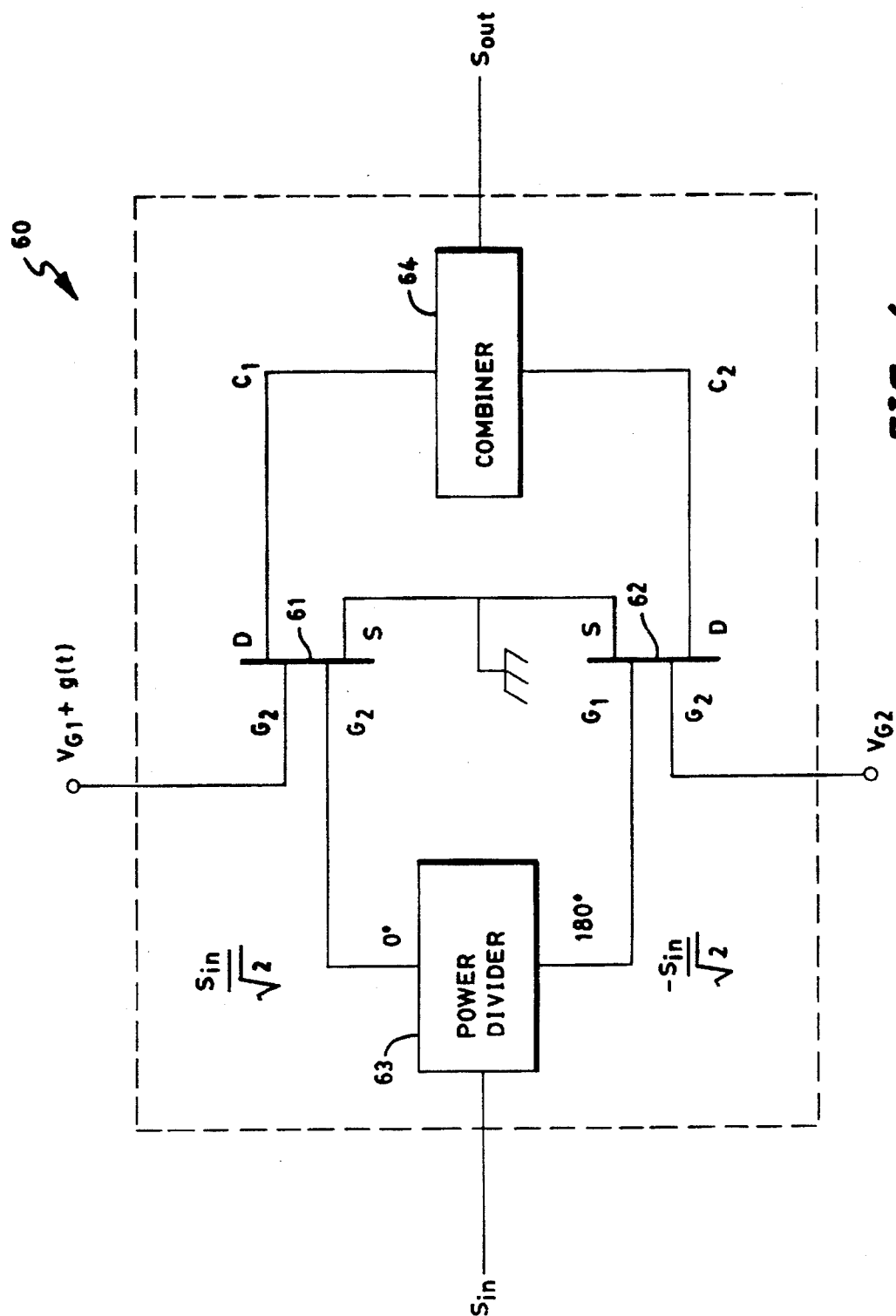
FIG. 6 is a schematic diagram of a multiplier circuit in accordance with the present invention.

In a preferred embodiment of the invention shown schematically in FIG. 6, the ideal multiplier is implemented with two dual-gate GaAs field-effect transistor (FET) amplifiers 61 and 62. FET amplifier 61 includes dual gate terminals $G_1$-$G_2$, drain terminal D, and source terminal S, while FET amplifier 62 likewise includes dual gate terminals $G_1$-$G_2$, drain terminal D, and source terminal S. The multiplier circuit further includes a power divider 63 receiving an input carrier signal $S_{in}$ and producing inverted and non-inverted versions of $S_{in}$. A combiner 64 receives output signals $C_1$ and $C_2$ from the FET amplifiers and produces a multiplier output signal $S_{out}$.

Referring specifically to the details of FIG. 6, FET amplifier 61 receives at terminal $G_1$ a carrier signal of value $B = S_{in}/\sqrt{2}$ from the 0° port of power divider 63, and also receives a control signal at gate $G_2$. This control signal is comprised of a DC component $V_{G1}$ and an AC modulating component g(t). FET amplifier 61 is responsive to the carrier and control signals, and produces an output signal $C_1$ on the drain terminal. The signal $C_1$ consists of an unmodulated carrier component of value $BG_1VG_1$ and an amplitude-modulated carrier component of value $Bkg(t)$. The variables k and $G_1$ represent gain constants of FET amplifier 61.

FET amplifier 62 receives at its gate terminal $G_1$ an inverted version of carrier signal $S_{in}$ from the 180° port of divider 63, and also receives a control signal at terminal $G_2$ which corresponds to a DC voltage $V_{G2}$. FET amplifier 62 is responsive to the inverted carrier and DC-level control signals, and produces an output $C_2$ on drain terminal D consisting of an unmodulated carrier of value $-G_2 V_{G2} B$. The variable $G_2$ is a gain constant of FET amplifier 62.

The outputs $C_1$ and $C_2$ of FET amplifiers 61 and 62 are combined by an in-phase combiner 64 to produce an output signal $S_{out}$ equalling $\{B \times [G_1 V_{G1} + G_2 V_{G2} + kg(t)]\}$. Since FET amplifiers 61 and 62 each receive an input from an out-of-phase divider 63, the unmodulated carrier components $(G_1 V_{G1} \times S_{in}/\sqrt{2})$ and $(G_2 V_{G2} \times S_{in}/\sqrt{2})$ $S_{out}$ can be cancelled by adjusting the DC voltages $V_{G1}$ and $V_{G2}$ applied to the two FET amplifiers. The resulting signal from the balanced multiplier circuit is therefore $[kg(t) \times B]$ or, equivalently, $\{kg(t) \times S_{in}/\sqrt{2}\}$. Thus, the circuit may be easily balanced to suppress the unmodulated carrier components in the output signal.

Figure 7:
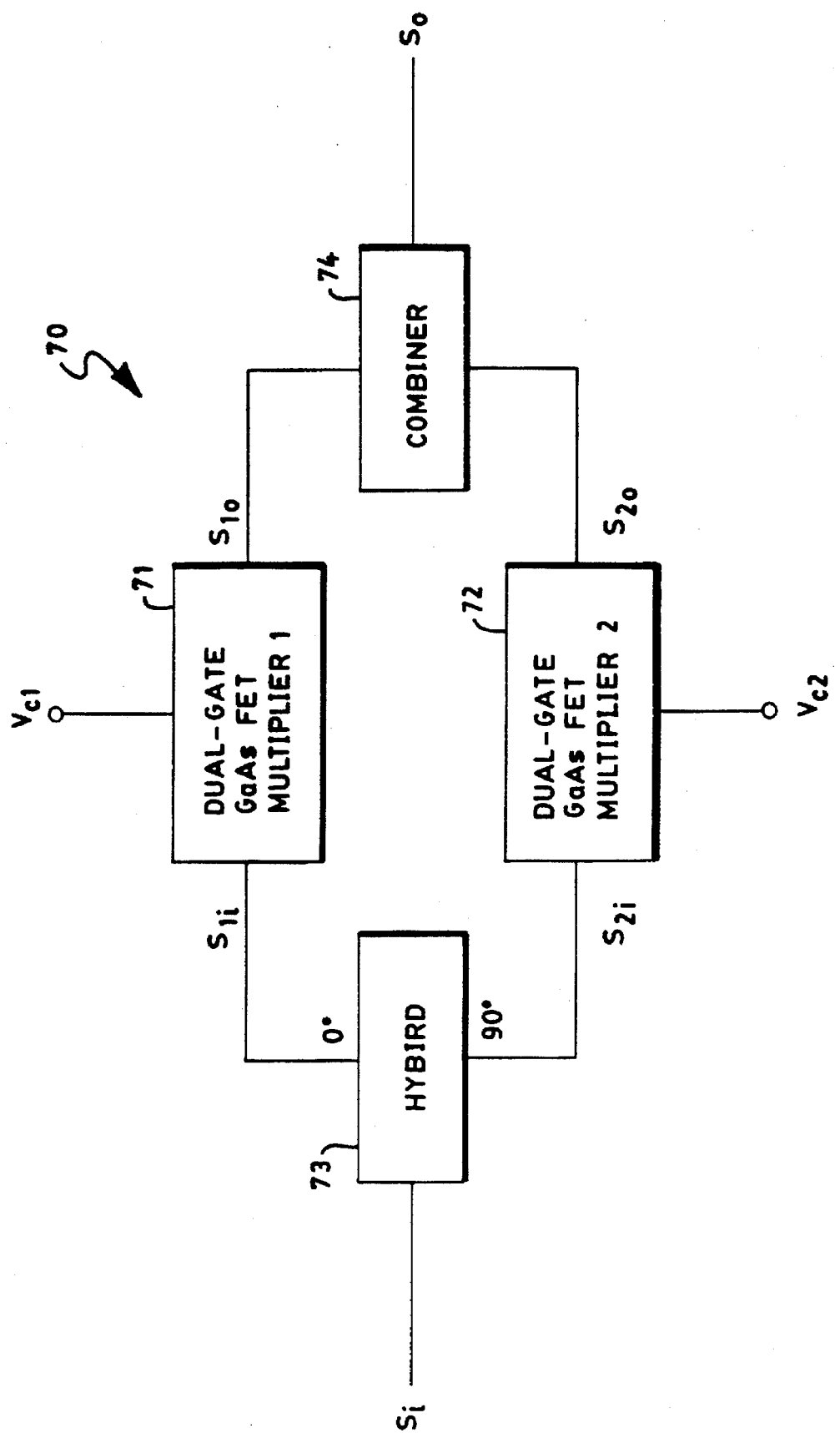
FIG. 7 is a block diagram of a frequency shifter utilizing the multiplier circuit of FIG. 6.

FIG. 7 shows a block diagram of a frequency shifter 70 having multipliers 71 and 72 each implemented with the dual-gate GaAs FET amplifier arrangement of FIG. 6. In multiplier 71, for example, carrier input $S_{1i}$ corresponds to $S_{in}$ in FIG. 6, while multiplier output $S_{1o}$ corresponds to $S_{out}$. The carrier inputs $S_{1i}$ and $S_{2i}$ of multipliers 71 and 72 are in quadrature phase relationship, as provided by hybrid device 73.

The shifter 70 includes a quadrature hybrid device 73 having a 0° output port and a 90° output port. A first multiplier 71 includes a carrier input $S_{1i}$ coupled to the 0° port of device 73, control input $v_{c1}$, and output $S_{1o}$. A second multiplier 72 includes a carrier input $S_{2i}$ coupled to the 90° port of device 73, control input $v_{c2}$, and an output $S_{2o}$. The outputs $S_{1o}$ and $S_{2o}$ are electrically summed by in-phase combiner 74 to provide output $S_o$.

During operational functioning of the shifter 70, a microwave carrier signal of frequency $f_o$ (represented mathematically by the electrical signal $S_i = V_i e^{j\omega_o t}$) is applied to the input terminal of quadrature hybrid device 73. The electrical response of each multiplier and the shifter 70 are indicated by the following mathematical expressions:

$S_{1i} = P_1 V_i e^{j\omega_o t}$, $S_{2i} = j P_2 V_i e^{j\omega_o t}$, $S_{1o} = A_1 v_{c1} P_1 V_i e^{j\omega_o t}$, $S_{2o} = j A_2 v_{c2} P_2 V_i e^{j\omega_o t}$, $S_o = (A_1 v_{c1} P_1 + j A_2 v_{c2} P_2) V_i e^{j\omega_o t}$, $V_i$ = peak input voltage, $\omega_o$ = applied microwave frequency, $= 2\pi f_o$, $P_1$ = fractional voltage at 0° port of quadrature hybrid 73, $P_2$ = fractional voltage at 90° port of quadrature hybrid 73, $v_{c1}$ = control voltage applied to multiplier 71, and $v_{c2}$ = control voltage applied to multiplier 72.

If the modulating signals $v_{c1}$ and $v_{c2}$ are selected to be in quadrature phase relation, and the constants $P_1, P_2, A_1$, and $A_2$ are equalized, the output $S_o$ will be a frequency-shifted version of the input carrier signal $S_i$. In particular, with the following values:

$A_1 = A_2 = A$,
$P_1 = P_2 = P$,
$v_{c1} = V_m \cos \omega_m t$, and
$v_{c2} = V_m \sin \omega_m T$. $\omega_m = 2\pi f_m$.

the output $S_o$ of the shifter 70 may be expressed as $$S_o = APV_i V_m (\cos \omega_m t + j \sin \omega_m t) e^{j\omega_o t}, \text{ or}$$

$$S_o = APV_i V_m e^{j(\omega_o + \omega_m)t}.$$

Alternatively, if $v_{c1} = V_m \sin \omega_m t$, and $v_{c2} = V_m \cos \omega_m t$, there will be a frequency shift of $(\omega_o - \omega_m)$ in the output signal. In general, then, when the modulating waves applied to each balanced multiplier circuit are in quadrature, the output frequency is shifted by an amount equal to that of the modulating wave.

The expression for $S_o$ indicates that the input carrier frequency of input microwave signal $S_i$ is shifted by an amount equal to $f_m$, thereby illustrating the functional capability of frequency shifting. If the frequency of the modulating signal $f_m$ is continuously adjusted, then the output microwave frequency will exhibit spectral "hopping."

Figure 8:
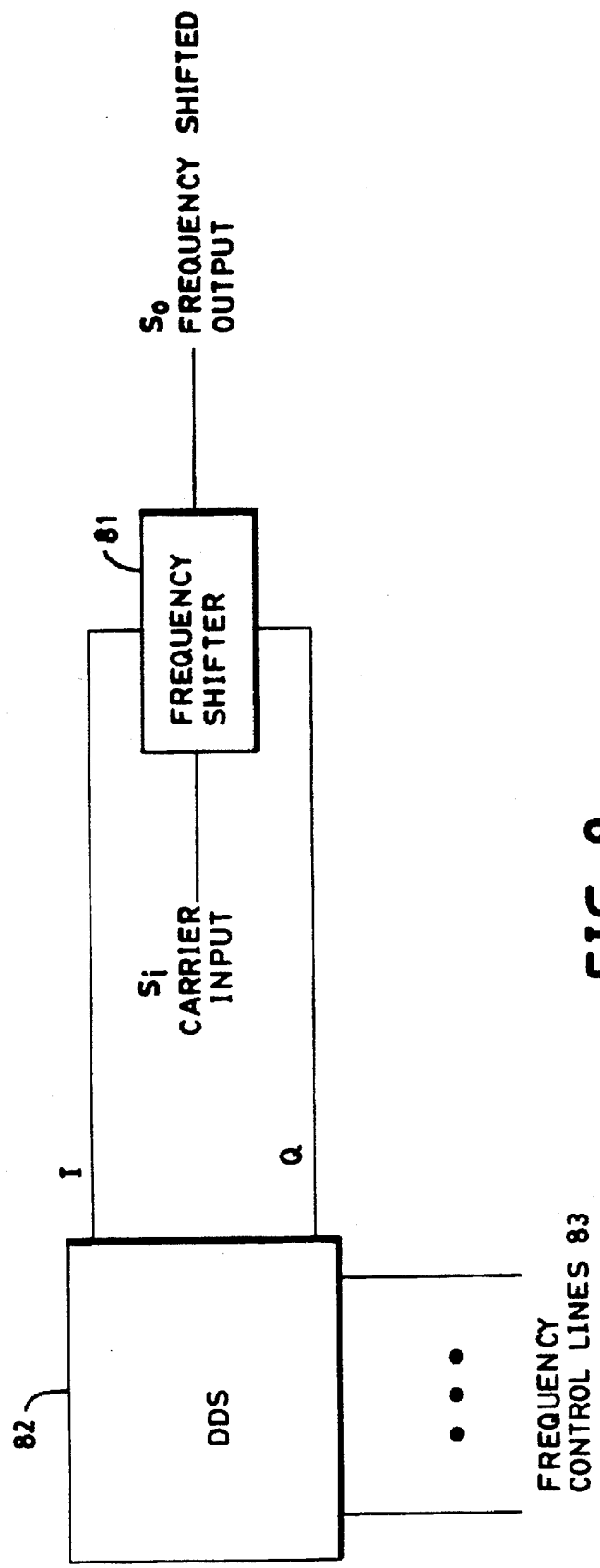
FIG. 8 is a block diagram of a frequency hopping communications system using the frequency shifter of FIG. 7.

FIG. 8 illustrates a block diagram of a frequency hopping system in accordance with the present invention. The system includes a frequency shifter as shown and described in FIG. 7, and a direct digital synthesizer (DDS) 82 having an I and Q output. These outputs from DDS 82 correspond to the quadrature signals vc1 and $v_{c2}$ being applied to FET multipliers 71 and 72, respectively, in FIG. 7.

The maximum output frequency of a DDS is limited to about 0.4 times the clock frequency. Since both GaAs FET gates in the microwave dual-gate multiplier have the same high frequency response, the overall frequency switching speed of the frequency hopping system is essentially that of the DDS. The output frequency of a DDS is changed by first entering the new frequency data on frequency control lines 83, and then sending the load command. In an exemplary DDS device, the output frequency is instantaneously switched to the new frequency after 34 clock cycles of pipeline delay, resulting in a minimum switching time of about 0.7 us if the DDS is driven by a 50 MHz clock.

What has been shown and described herein is a phase modulating synthesizer using a continuous phase accumulator realized by dual-gate FET amplifier devices. In particular, a frequency shifter is implemented with two multiplier circuits each having two dual-gate field effect transistor (FET) amplifiers, and provides frequency shifting of a carrier signal by an amount equal to the frequency of the modulating wave applied in quadrature to the multiplier circuits.

Both the carrier feed-through and the levels of undesired sidebands depend on circuit balance. Consequently, in the present invention, any amount of carrier and sideband suppression can be achieved by proper circuit adjustments. Such adjustment would be made, for example, to the DC voltages applied to the two FET amplifiers. Performance tests of the frequency synthesizer have indicated sideband levels of less than −30 dB with circuit phase balance within 3.5°, and carrier suppression of better than −30 dB with circuit balance of 1.7°.

The frequency hopping synthesizer has the advantage of fast switching speed, compact size, and low power consumption. Accordingly, the hopping synthesizer of the present invention is ideally suited for applications requiring moderate hopping bandwidths, fast switching speed, compact size, and simplicity. For example, suitable communication system applications would include mobile cellular telephone systems or automatic measurement systems. The dual-gate GaAs FETs and associated circuitry may preferably be fabricated monolithically on a single chip platform.

While there has been shown and described herein what are at present considered the preferred embodiments of the invention, it will be obvious to those skilled in the art that various changes and modifications can be made therein without departing from the scope of the invention as defined by the appended Claims.

What is claimed is:

1. A multiplier circuit, comprising:

first FET amplifier means responsive to a carrier signal and a modulation signal to produce a composite FET output signal comprising an unmodulated and modulated carrier component;

second FET amplifier means responsive to an inverted version of said carrier signal and a DC input to produce an unmodulated carrier FET output signal; and means coupled to said first and second FET amplifier means for in-phase combining the composite FET output signal and the unmodulated carrier FET output signal to produce an output signal including the modulated carrier component.

2. A multiplier circuit, comprising:

division means for dividing an input carrier signal into a first carrier signal and a second carrier signal having a 180° phase relationship therebetween;

a first field effect transistor having a first gate terminal operationally coupled to receive the first carrier signal, a second gate terminal operationally responsive to be a modulation signal, a drain terminal, and a source terminal coupled to ground;

a second field effect transistor having a first gate terminal operationally coupled to receive the second carrier signal, a second gate terminal operationally responsive to be a DC signal, a drain terminal, and a source terminal coupled to ground; and combiner means operationally coupled to receive an output signal from the respective drain terminals of said first and second field effect transistors, and in-phase combining said output signals to produce an output signal including a modulated carrier component.

3. The multiplier circuit as recited in claim 2 further comprises:

composite signal means for applying a composite DC and AC signal to the second gate terminal of said first field effect transistor; and DC signal means for applying a DC signal to the second gate terminal of said second field effect transistor.

4. The multiplier circuit as recited in claim 3 further comprises:

means coupled to said composite signal means and said DC signal means for independently adjusting the level of said DC signals.

5. A frequency shifter, comprising:

first FET multiplier means responsive to a first carrier signal and a first modulation signal to produce a first modulated carrier component;

second FET multiplier means responsive to a second carrier signal and a second modulation signal to produce a second modulated carrier component;

summation means coupled to said first and second FET multiplier means for in-phase combining the first and second modulated carrier components to produce a frequency-shifted carrier output; and said first and second FET multiplier means each comprising a first FET amplifier means responsive to the respective carrier signal and the respective modulation signal to produce a composite FET output signal comprising an unmodulated and modulated carrier component, a second FET amplifier means responsive to an inverted version of said respective carrier signal and a DC component to produce an unmodulated carrier FET output signal, and means coupled to said first and second FET amplifier means for in-phase combining said composite FET output signal and said unmodulated carrier FET output signal.

6. The frequency shifter as recited in claim 5 wherein the first and second carrier signals are in quadrature phase relationship; and the first and second modulation signals are in quadrature phase relationship.

7. A frequency hopping synthesizer, comprising:

first FET multiplier means responsive to a first carrier signal and a first modulation signal to produce a first modulated carrier component;

second FET multiplier means responsive to a second carrier signal and a second modulation signal to produce a second modulated carrier component;

summation means coupled to said first and second FET multiplier means for in-phase combining the first and second modulated carrier components to produce a frequency-shifted carrier output; and direct digital synthesizer means operationally coupled to the first and second FET multiplier means and responsive to a digital control input for generating said first and second modulation signals; and wherein the first and second FET multiplier means each comprises a first FET amplifier means responsive to the respective carrier signal and the respective modulation signal to produce a composite FET output signal comprising an unmodulated and modulated carrier component;

a second FET amplifier means responsive to an inverted version of said respective carrier signal and a DC component to produce an unmodulated carrier FET output signal; and means coupled to said first and second FET amplifier means for in-phase combining said composite FET output signal and said unmodulated carrier FET output signal.

\* \* \* \* \*